US010038455B2

(12) United States Patent
Dartois

(10) Patent No.: US 10,038,455 B2
(45) Date of Patent: Jul. 31, 2018

(54) SIGNAL MODULATION FOR RADIOFREQUENCY COMMUNICATIONS

(71) Applicant: Alcatel Lucent, Boulogne Billancourt (FR)

(72) Inventor: Luc Dartois, Nozay (FR)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 15/308,216

(22) PCT Filed: May 5, 2014

(86) PCT No.: PCT/EP2014/059048
§ 371 (c)(1),
(2) Date: Nov. 1, 2016

(87) PCT Pub. No.: WO2015/169328
PCT Pub. Date: Nov. 12, 2015

(65) Prior Publication Data
US 2017/0317686 A1 Nov. 2, 2017

(51) Int. Cl.
*H03M 3/00* (2006.01)
*H04B 1/04* (2006.01)
(Continued)

(52) U.S. Cl.
CPC .......... *H03M 3/402* (2013.01); *H03F 1/3241* (2013.01); *H03F 3/19* (2013.01);
(Continued)

(58) Field of Classification Search
CPC .......... H03F 1/3241; H03F 3/245; H03F 3/19; H03F 2200/451; H03F 2201/3233;
(Continued)

(56) References Cited

U.S. PATENT DOCUMENTS 8,755,447 B2 * 6/2014 Goodson ................. H03M 3/50
375/150

FOREIGN PATENT DOCUMENTS

WO    WO 92/15153 A2    9/1992
WO    WO 01/97384 A1    12/2001

OTHER PUBLICATIONS

Peter Craven, "Toward the 24-bit DAC: Novel Noise-Shaping Topologies Incorporation Correction for the Nonlinearity in a PWM Output Stage," Audio Engineering Society, Journal of the Audio Engineering Society, vol. 41, No. 5, pp. 291-313, XP000432100, May 1993.

(Continued)

*Primary Examiner* — Jean B Corrielus
(74) *Attorney, Agent, or Firm* — Fay Sharpe, LLP

(57) ABSTRACT

A signal modulation device comprising: an input for receiving a complex input signal (106) comprising an in-phase component signal and a quadrature-phase component signal, a sigma-delta modulator (110) for modulating the complex input signal at an oversampling clock rate (F1) into an intermediary signal (112), a numerical oscillator (60) for generating a phase signal (61) oscillating at a selected carrier frequency (FC), wherein the phase signal takes a finite number of quantized states, and a symbol mapping table (114) comprising a predefined quantized symbol for each quantized complex state of the intermediary signal and each quantized state of the phase signal, and operates at each oversampling clock period (F1) to select a quantized symbol (116) as a function of a current quantized complex state of the intermediary signal (112) and a current quantized state of the phase signal (61).

10 Claims, 11 Drawing Sheets

(51) Int. Cl.
*H03F 3/19* (2006.01)
*H03F 3/24* (2006.01)
*H03F 1/32* (2006.01)

(52) U.S. Cl.
CPC .............. *H03F 3/245* (2013.01); *H04B 1/04* (2013.01); *H04B 1/0475* (2013.01); *H03F 2200/451* (2013.01); *H03F 2201/3233* (2013.01); *H04B 2001/045* (2013.01); *H04B 2001/0408* (2013.01)

(58) Field of Classification Search
CPC ....... H03M 3/402; H04B 1/04; H04B 1/0475; H04B 2001/045; H04B 2001/0408
See application file for complete search history.

(56) References Cited

OTHER PUBLICATIONS

Mohammad Mojtaba Ebrahimi et al, "Delta-Sigma-Based Transmitters," IEEE Microwave Magazine, vol. 14, No. 1, pp. 68-78, XP011491633, 2013.
International Search Report for PCT/EP2014/059048 dated Feb. 4, 2015.

* cited by examiner

SIGNAL MODULATION FOR RADIOFREQUENCY COMMUNICATIONS

FIELD OF THE INVENTION

The invention relates to the technical field of signal modulation devices and methods for radiofrequency communications, especially for providing an output signal to a radio frequency front-end, in particular a switched-mode power amplifier.

BACKGROUND

Switched-mode is an emerging technology for achieving high power efficiency in Radio Frequency (RF) power amplifiers. Switched-mode means that the power transistors are either in a fully conducting state or in a completely shut-off state. A filter at the output is then often needed to remove unwanted harmonics and quantization noise of the switch frequency.

A method of achieving a band pass RF signal is to use band pass sigma delta modulation (BPSDM) working at four times the RF carrier frequency. Developments based on this method are disclosed for example in EP-A1-2330734 or EP-A1-2403136. However such techniques lead to the constraints of generating four pulses per carrier period and having the whole digital chain, including BPDSM, work at a very high frequency higher than the wanted RF carrier frequency, which causes huge technology constraints.

Craven P. "Toward the 24-bit DAC: novel noise-shaping topologies incorporating correction for the nonlinearity in a PWM output stage", J. Audio Eng. Soc., Vol. 41, No 5. (XP000432100) discloses a nonlinear noise shaper, which includes a digital simulation of the intrinsic PWM non linearity and correction through feedback or a combination of feedforward and feedback.

WO-A1-2001/97384 discloses methods for reducing distortion and noise in high power digital PWM amplifiers by measuring the difference between the desired output signal and the actual output signal on a pulse by pulse basis.

WO-A2-9215153 discloses a signal convertor comprising a pulse modulator, and means for modifying the signal input thereto in dependence upon the error in previous values of the output thereof, to reduce the effects of the error within a desired signal band.

SUMMARY

In accordance with a first object, the invention provides a method for generating a symbol mapping table in a memory for mapping a finite number of quantized complex output states of a modulation device operating at a first oversampling clock rate to quantized symbols, the method comprising:
selecting a carrier frequency,
selecting an initial set of pulse train segments having a time-granularity corresponding to a second oversampling clock rate,
determining a complex energy coefficient of the pulse train segments of the initial set at the carrier frequency,
selecting a subset of the pulse train segments of which the complex energy coefficients at the carrier frequency closely approximate the quantized complex output states of the modulation device, so that each quantized complex output state is uniquely mapped to a pulse train segment of the subset,
for each pulse train segment mapped to a quantized complex output state, recording at a memory address associated to the quantized complex output state a quantized symbol encoding the pulse train segment.

According to embodiments, such methods can comprise one or more of the features below.

In embodiments, the method is further for generating a digital predistortion table in the memory, the method further comprising:
for each pulse train segment mapped to a quantized complex output state, determining a complex predistorsion symbol as a function of the complex energy coefficient of the pulse train segment at the carrier frequency, and recording the predistorsion symbol at a memory address associated to the quantized complex output state.

In embodiments, the step of selecting a subset of the pulse train segments comprises:
computing a complex-plane distance between a quantized complex output state of the modulation device and the complex energy coefficient of each pulse train segment,
mapping the quantized complex output state to a pulse train segment which yields a minimum of the complex-plane distance,
and discarding the pulse train segments which are not mapped to any quantized complex output state.

In embodiments, the method further comprises:
determining a center of a complex constellation of the complex energy coefficients at the carrier frequency,
offsetting the complex constellation by a complex number to substantially match the center of the complex constellation with the center of a second constellation made up of the quantized complex output states of the modulation device.

In embodiments, the method further comprises:
determining a first circle which is geometrically inscribed within the complex constellation of the complex energy coefficients at the carrier frequency, and
scaling the complex constellation to substantially equate the radius of the inscribed circle with a peak energy of the quantized complex output states of the modulation device.

In embodiments, the step of selecting an initial set of pulse train segments comprises selecting a binary word length, and constructing a set of width-modulated and/or position-modulated pulse train segments which can be uniquely represented by a binary word having the selected binary word length.

In embodiments, the step of selecting an initial set of pulse train segments comprises selecting a constraint, and constructing a set of width-modulated and/or position-modulated pulse train segments which satisfy the constraint.

Such an initial constraint may be imposed to meet a variety of objectives. In embodiments, the constraint serves to preconfigure the pulse train segments so as to emphasize a harmonic of the pulse train segments located in a second Nyquist zone at the carrier frequency, so that a carrier frequency above the first oversampling clock rate can be synthesized with maximum power and minimum quantization noise.

In embodiments, the constraint defines a fixed number of pulses per pulse train segment, especially one pulse per pulse train segment or two pulses per pulse train segment.

In embodiments, the constraint defines a logical relation between a first half and a second half of the pulse train segment, especially defines equality, sign opposition or complementarity between the first half and the second half of the pulse train segment.

In embodiments, the constraint defines a fixed value for a second half of the pulse train segment.

In embodiments, the pulses in the pulse train segments comprise single-level pulses.

In embodiments, the pulses in the pulse train segments comprise multi-level pulses, especially pulses having two or three amplitude states beyond zero.

In embodiments, the step of determining a complex energy coefficient of a pulse train segment at the carrier frequency comprises computing a point of the discrete Fourier transform of the pulse train segment at the desired carrier frequency.

In embodiments, the step of determining a complex energy coefficient of a pulse train segment at the carrier frequency comprises feeding the pulse train segment to a radio frequency front-end for radiating an electromagnetic field and measuring an energy content of the radiated electromagnetic field at the carrier frequency.

In an embodiment, the invention also provides a memory comprising at least one of a symbol mapping table and a digital predistortion table generated by the above-described methods.

In an embodiment, a method of using such a memory comprises:
receiving an intermediary signal at the first oversampling clock rate,
reading a quantized symbol in the symbol mapping table at a memory address associated to a current quantized complex state of the intermediary signal,
reading a predistortion symbol in the digital predistortion table at a memory address associated to the current quantized complex state of the intermediary signal,
generating a pulse train segment encoded by the quantized symbol, and
providing the predistortion symbol as a feedback signal to a sigma-delta modulator.

According to embodiments, such methods can comprise one or more of the features below.

In an embodiment, the generated pulse train segment includes multilevel pulses, and the method further comprises converting the multi-level pulse train segment into a plurality of parallel single-level pulse train segments as a function of a multi-branch power amplifier design and feeding each single-level pulse train segments to a corresponding feed branch of the power amplifier.

In embodiments, the multi-branch power amplifier design may be two-way symmetric pulse feed, two-way asymmetric 1:2 pulse feed Doherty or three-way symmetric pulse feed Doherty, or other.

Aspects of the first object of invention are based on the ideas of enabling arbitrary choices of pulses, through the use of precomputed code books, so as to vary a number of pulses per carrier period or to select an optimized set of pulses for a given carrier frequency. Aspects of the first object of invention are based on the observations that a careful selection of pulses to be used can produce a positive impact on a variety of system features and requirements, i.e. clock rate requirements, coding efficiency, in-band signal to noise ratio, capacitive losses in drivers and power amplifiers, and others.

In accordance with a second object, the invention provides a signal modulation device for providing an output signal to a radio frequency front-end, the device comprising:
an input for receiving a complex input signal comprising an in-phase component signal and a quadrature-phase component signal,
a sigma-delta modulator for modulating the complex input signal at an oversampling clock rate into an intermediary signal, wherein the intermediary signal takes a first finite number of quantized complex states,
a symbol mapping table for mapping the quantized complex states of the intermediary signal to predefined quantized symbols each encoding a pulse train segment of the output signal, and
a numerical oscillator for generating a phase signal oscillating at a selected carrier frequency, wherein the phase signal takes a second finite number of quantized states,
wherein the symbol mapping table comprises a predefined quantized symbol for each quantized complex state of the intermediary signal and each quantized state of the phase signal, and operates at each oversampling clock period to select a quantized symbol as a function of a current quantized complex state of the intermediary signal and a current quantized state of the phase signal.

According to embodiments, such signal modulation devices can comprise one or more of the features below.

In embodiments, the device further comprises a digital predistortion table for mapping the quantized complex states of the intermediary signal to predefined predistorsion symbols, and a feedback loop for providing the predistorsion symbols to the sigma-delta modulator.

In embodiments, the digital predistortion table comprises a predefined predistortion symbol for each quantized complex state of the intermediary signal and each quantized state of the phase signal, and operates at each oversampling clock period to select a predistortion symbol as a function of the current quantized complex state of the intermediary signal and the current quantized state of the phase signal.

In embodiments, the predistorsion symbol associated to a complex quantized state of the intermediary signal and a quantized state of the phase signal is a function of an energy coefficient of the pulse train segment encoded by the corresponding quantized symbol at the carrier frequency and a complex phase coefficient corresponding to the quantized state of the complex phase signal.

In embodiments, the device further comprises a pulse generator arranged to receive the quantized symbol selected at each oversampling clock period, wherein the pulse generator is adapted to generate a pulse train segment as a function of the received quantized symbol, wherein the pulse generator operates at a second oversampling clock rate.

In embodiments, the quantized symbol comprises a parallel binary sequence and wherein the pulse generator comprises a serializer adapted to serialize the parallel binary sequence at the second oversampling clock rate.

In embodiments, the phase signal is coded over a predefined number of bits, e.g. over 4 bits.

In embodiments, the numerical oscillator comprises a phase accumulator operating as function of a control signal defining the selected carrier frequency coded over the predefined number of bits and a clock signal at the first oversampling clock rate, the device further comprising a multi-stage low pass noise shaping sigma delta filter arranged to provide the control signal coded over the predefined number of bits by filtering a refined control signal coded over a higher number of bits.

In embodiments, the device further comprises a rate-adjustable clock arranged to provide a clock signal at the first oversampling clock rate, wherein the first oversampling clock rate is adjustable over a small adjustment range.

In embodiments, the symbol mapping table is obtained by executing the steps of:

selecting an initial set of pulse train segments having a time-granularity corresponding to a second oversampling clock rate,
determining a complex energy coefficient of the pulse train segments of the initial set at the carrier frequency, and
for each quantized state of the phase signal,
computing a complex phase coefficient corresponding to the quantized state of the complex phase signal, and
selecting a subset of the pulse train segments of which the complex energy coefficients at the carrier frequency closely approximate the quantized complex states of the intermediary signal multiplied by the complex phase coefficient, so that each quantized complex state of the intermediary signal is uniquely mapped to a pulse train segment of the subset, e.g. the best fitting pulse train segment,
for each pulse train segment mapped to a quantized complex output state, recording a quantized symbol encoding the pulse train segment at a memory address associated to a combination of the quantized complex state of the intermediary signal combined and the quantized state of the phase signal.

In accordance with the second object, the invention also provides a signal modulation method for providing an output signal to a radio frequency front-end, the method comprising:
receiving a complex input signal comprising an in-phase component signal and a quadrature-phase component signal,
sigma-delta modulating the complex input signal at an oversampling clock rate into an intermediary signal, wherein the intermediary signal takes a first finite number of quantized complex states,
generating a phase signal oscillating at a selected carrier frequency, wherein the phase signal takes a second finite number of quantized states,
accessing a symbol mapping table at each oversampling clock period to select a quantized symbol encoding a pulse train segment of the output signal as a function of a current quantized complex state of the intermediary signal and a current quantized state of the phase signal,
wherein the symbol mapping table comprises a predefined quantized symbol for each quantized complex state of the intermediary signal and each quantized state of the phase signal.

Aspects of the second object of invention are based on the idea of enabling a choice of the carrier oversampling ratio, thereby limiting clock rate requirements. Aspects of the second object of invention stem from the observation that enabling a higher carrier frequency generation at a same oversampling clock rate helps reduce pulses density to relax constraints on power amplifiers and driver chains and therefore reduce power consumption in gate capacitors charge and discharge.

BRIEF DESCRIPTION OF THE DRAWINGS

These and other aspects of the invention will be apparent from and elucidated with reference to the embodiments described hereinafter, by way of example, with reference to the drawings.

DETAILED DESCRIPTION OF THE EMBODIMENTS

There will be described embodiments of a signal modulation device provided for a switched-mode power amplifier that can be used in wireless communications networks, for instance in 3G, 4G and above. The radio carrier frequencies used in such networks depend on both technical and regional spectrum regulatory constraints and range typically between 700 MHz and 2.7 GHz.

Figure 1:
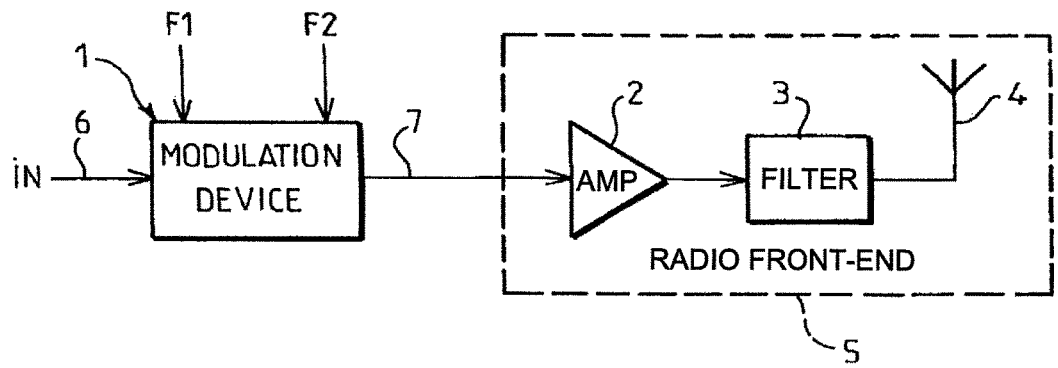
FIG. 1 is a functional representation of a radio frequency transmitter for digital communications.

With reference to FIG. 1, a digital RF transmitter is schematically depicted. The digital RF transmitter comprises a digital modulation device 1, a power amplifier 2, a band pass output filter 3 and an antenna 4. The power amplifier 2, band pass output filter 3 and antenna 4 can be referred to as a radio front-end 5, by contrast with digital modulation device 1.

The modulation device 1 comprises two quantizer stages that respectively operate at a first oversampling clock rate F1 and a second oversampling clock rate F2. A ratio between the oversampling clock rates F1 and F2 will be denoted by $$N = \frac{F2}{F1}.$$

The modulation device 1 receives a complex baseband signal 6 at an input. The sampling rate of the baseband signal 6 will be denoted F0. The oversampling ratio between the sampling rate F0 and the first oversampling clock rate F1 will be denoted by $$M = \frac{F1}{F0}.$$

In an implementation, the baseband signal 6 may be received as two parallel scalar components, i.e. an in-phase component denoted by I and a quadrature-phase component denoted by Q. In the following, there will be described signal processing methods applied to the complex baseband signal 6, e.g. sigma delta modulation. By virtue of linearity, the skilled person will appreciate that the sigma delta modulation of complex signals can be implemented as two parallel sigma delta modulation processes for each scalar component making up the complex signal.

The modulation device 1 transmits to the radio front-end 5 a frequency-converted time-domain pulsed signal 7 that encodes the information content of the baseband signal 6 in the position and/or width and/or amplitude of the pulses.

Figure 2:
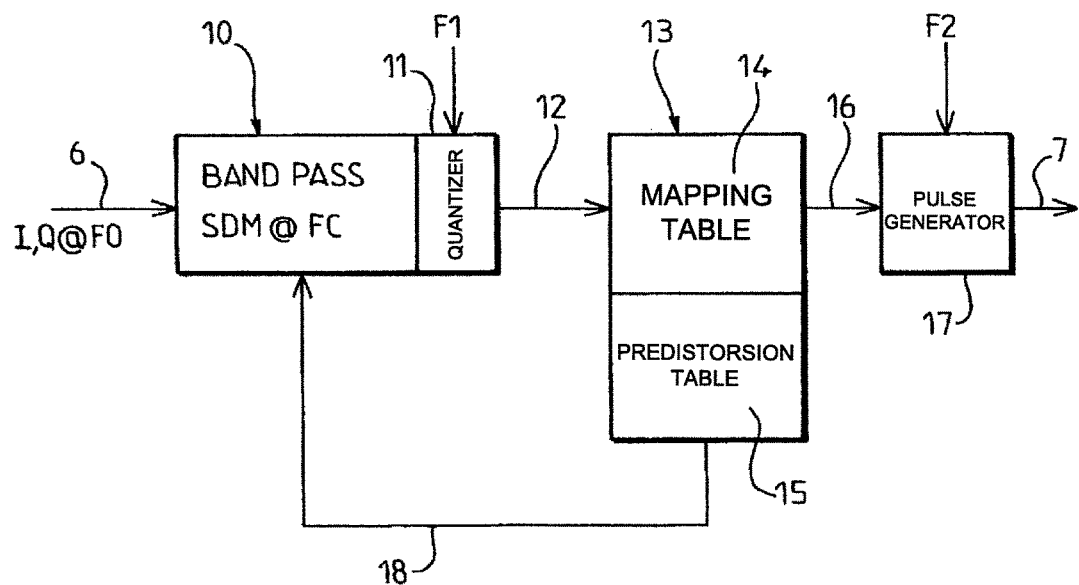
FIG. 2 is a functional representation of a signal modulation device that can be used in the transmitter of FIG. 1.

With reference to FIG. 2, an embodiment of the modulation device 1 will now be described, in which BPSDM is employed. As known in the art, a band pass sigma delta modulator operates to frequency-convert a useful information signal into a frequency band of interest, a.k.a. clean bandwidth, while rejecting quantization noise outside the frequency band of interest. The noise transfer function of such a modulator has a typical notched envelope that is illustrated in the simulation results of FIG. 13. The quantization noise rejected outside the clean bandwidth can be post-filtered by the band pass output filter 3.

For the sake of conciseness, it will be sufficient to note that the band pass sigma delta modulator 10 of FIG. 2 is designed so that its clean bandwidth is centered on a selected carrier frequency of the RF transmitter. The carrier frequency will be denoted by FC in the following. As BPSDM is a known technique, the skilled reader is referred to technical literature for further information about BPSDM implementation. A specific embodiment of an emulated band pass sigma delta modulator will also be described in a further portion of the present specification.

Hence, the modulation device of FIG. 2 comprises the band pass sigma delta modulator 10 which is arranged to receive and process the baseband signal 6. The band pass sigma delta modulator 10 comprises a first quantizer 11, which operates at the oversampling clock rate F1 to deliver an intermediary signal 12 at an output. As an illustration, the oversampling ratio M may be between 10 and 30. The band pass sigma delta modulator 10 may typically include integration stages to the 3$^{rd}$ or 4$^{th}$ order to obtain a Signal-to-Noise ratio of about 60 dB or higher over up to 5% of the SDM band.

Figure 3:
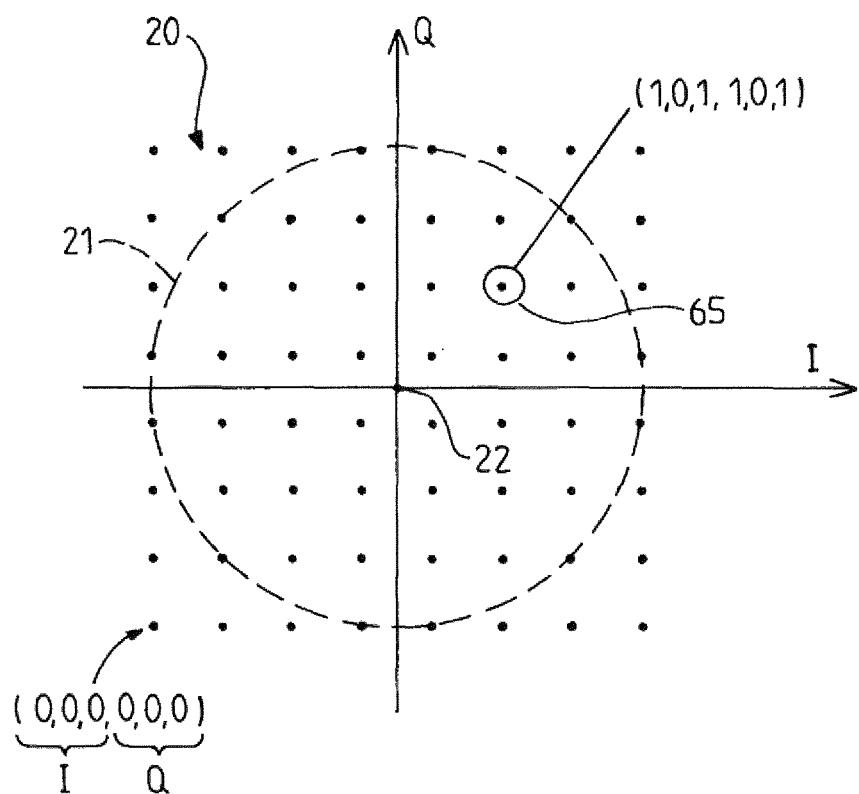
FIG. 3 is a graph showing a complex constellation that can be obtained with a sigma delta modulator of the modulation device of FIG. 2.

Hence, the intermediary signal 12 is a quantized complex signal that takes a quantized state within a given complex constellation 20 at each F1 clock period. In an embodiment, the quantized states of intermediary signal 12 are complex states coded over 6 bits, i.e. 3 bits for the I-component and 3 bits for the Q-component. FIG. 3 illustrates the complex constellation 20 of the quantized states of the intermediary signal 12 in this embodiment. Of course, the quantizer 11 could produce a different number of states as well, i.e. to yield a richer or poorer constellation.

Next, a random-access memory 13 is provided to store a symbol mapping table 14 and a digital predistorsion table 15. The symbol mapping table 14 is accessed at each F1 clock period at a memory address associated to the current state of the intermediary signal 12 to deliver a quantized symbol stored at that address, a.k.a. pulse code 16. The pulse code 16 encodes a predefined pulse train segment that will be generated as the time-domain pulsed signal 7 by a pulse generator 17 upon receiving the pulse code 16 at each F1 clock period. The pulse generator 17 operates at the second oversampling frequency F2, so that the shortest pulse that can be generated is equal to the F2 clock period.

In an embodiment, the pulse code 16 is binary word having a word length equal to the oversampling ratio N and the pulse generator 17 is a serializer that generates a single-level pulse train segment 30 by serialization of the pulse code 16, i.e. a binary amplitude coded signal at the second oversampling frequency F2. An illustration of two such pulse codes 16 and corresponding pulse train segments 30 is shown on FIG. 4.

Similarly, the digital predistorsion table 15 is accessed at each F1 clock period at a memory address associated to the current state of the intermediary signal 12 to deliver a complex predistorsion symbol stored at that address, a.k.a. complex power coefficient 18. The complex power coefficient 18 is fed back to the band pass sigma delta modulator 10 through a feedback loop to act as direct form predistorsion of the intermediary signal 12.

It will be appreciated that, in accordance with the above described functioning, a large variety of pulse trains can be generated, which mostly depend on the manner in which the symbol mapping table 14 has been populated. The symbol mapping table 14 operates as a dictionary, a.k.a. pulse codebook that predefines a finite set of pulse train segments of which the time-domain pulsed signal 7 is eventually constituted. Therefore the above-described system is highly adaptable. In particular, the selection of a pulse codebook can be optimized as a function of a number constraints and requirements of the application case.

In reference to FIG. 21, there will be described a method for selecting a pulse codebook and populating the symbol mapping table 14 and digital predistorsion table 15 accordingly. The selection of the codebook is intended to enable an adequate representation of all the quantized complex states of the intermediary signal 12. In the following, it is assumed that the intermediary signal 12 is limited by a constant envelope signal. Hence, the quantized states of intermediary signal 12 are confined, at least in a statistically significant manner, within a unitary circle representing nominal signal power. Such a unitary circle is depicted at numeral 21 in FIG. 3.

The pulse codebook selection is an offline process that starts with the selection of an initial set of candidate pulse train segments at step 40. This initial selection may take into account more or less demanding constraints, i.e. to obtain a larger or smaller initial set of candidate pulse train segments.

A constraint to be taken into account is the binary word length of the pulse code. With single level pulses, the feasible binary word length is at most equal to the oversampling ratio N. For the sake of illustration, it will be assumed that the binary word length is equal to the oversampling ratio N in the following.

Figure 4:
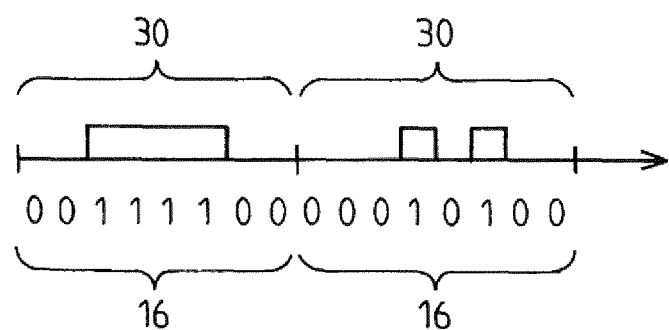
FIG. 4 is a schematic representation of pulse train segments that can be encoded in a symbol mapping table of the modulation device of FIG. 2.

If the word length is the only constraint imposed, an initial set of $2^N$ (2 power N) pulse train segments ensues. FIG. 4 illustrates two such pulse train segments 30 for N=8. Namely, the time length of a pulse train segments 30 is the F1 clock period and the time granularity of a pulse is the F2 clock period. The information of a pulse train segment is encoded in both the position and width of the pulses, a scheme referred to as Pulse Position and Width Modulation (PPWM).

Figure 5:
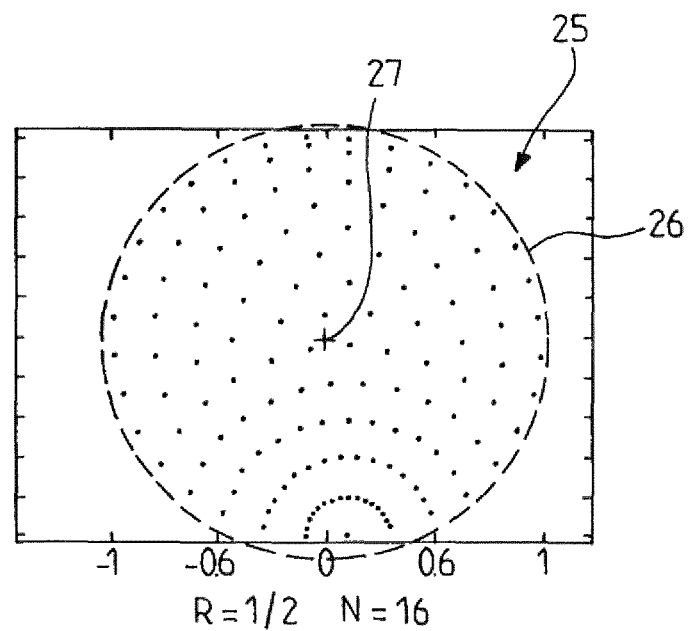
FIGS. 5 and 6 illustrate the complex constellation of a predefined set of pulse train segments at two different carrier frequencies.
Figure 6:
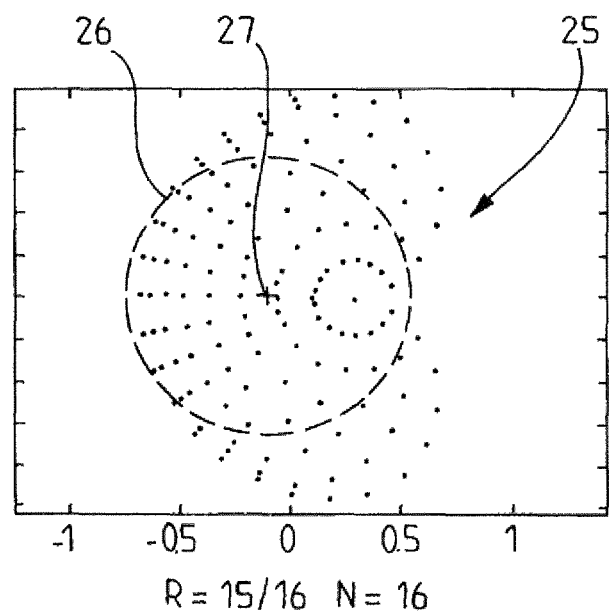

Once the initial set of candidate pulse train segments is identified, the method goes on to compute the complex energy of each candidate pulse train segment at the RF carrier frequency of interest FC at step 41. This computation can be done through direct Fourier transform of the time-domain pulse train segment. A complex constellation 25 of the candidate pulse train segments is obtained. Such constellations are illustrated in FIGS. 5 and 6 in an embodiment.

At step 42, optionally, the resulting complex constellation 25 is offset and/or scaled to superimpose a dense portion of the complex constellation 25 to the statistically significant portion of the quantized complex states of the intermediary signal 12. The offsetting of the constellation in the complex plane is equivalent to varying a continuous wave component of the pulse train segment, which has no practical implication on the emitted RF signal. The scaling of the constellation is equivalent to varying a peak energy of the pulses.

In an embodiment, step 42 can be implemented as follows: a center 27 of the original complex constellation 25 is determined through geometrical considerations, as a center of mass of the useful part of the complex constellation 25. Then the center 27 is offset to match with the center 22 of the complex constellation 20. Then the largest circle 26 inscribed within the complex constellation 25 is determined. Then the constellation 25 is scaled to match the radius of circle 26 with the radius of circle 21. This corresponds to adjusting the SDM loop gain and defining peak energy of the input I-Q signal.

The method goes on to step 43 in which a distance optimization method is applied to find a closest mapping symbol within the constellation 25—potentially offset and/or scaled as the case may be—for each complex quantized state within the constellation 20. For example, a complex quantized state is selected within the constellation 20, then the complex plane distance of that state to each point in the constellation 25 is computed and the constellation point of constellation 25 that minimizes that distance is selected as the mapping symbol. Although the mapping is explained in the frequency domain, i.e. through the energy of samples at carrier frequency FC, it should be noted that a selection of time-domain signals ensues, i.e. a subset of the candidate pulse train segments is selected as those pulse train segments of which the complex energy at the carrier frequency FC most closely matches the quantized complex states of the intermediary signal 12. The remaining irreducible mismatch between the best matching pulse train segments and the complex states of intermediary signal 12 will cause the final quantization noise as a systematic error of the method. However, the level of that systematic error can be controlled. Of course, the higher the oversampling ratio N, the lower the systematic quantization noise because the accessible codebook becomes richer with growing parameter N.

At step 44, for each selected pulse train segment, the complex energy at the carrier frequency FC is stored in predistorsion table 15 at an address associated to the corresponding quantized complex state of the intermediary signal 12 and the pulse code encoding the pulse train segment is stored in mapping table 14 at an address associated to the corresponding quantized complex state of the intermediary signal 12.

There will now be described different rules that may be used at step 40 for the initial set selection.

A first class of rules consists in limiting the number of signal transitions in an F1 clock period, with a view to reduce power consumption and needed amplifier bandwidth in the radio front-end 5. In particular, the number of pulses per pulse train segment can be limited to one in this manner, by limiting the number of 0-1 transitions and the number of 1-0 transitions to one per pulse train segment, a.k.a. single-pulse constraint. As an illustration, 37 pulse train segments meet the single-pulse constraint within the unconstrained set of 256 for 8 bits pulse codes. FIG. 4 shows a pulse code 00111100 that meets the single-pulse constraint and a pulse code 00010100 that does not. Similarly, 137 pulse train segments meet the single-pulse constraint for 16-bits pulse codes.

The single-pulse constraint is further illustrated by FIGS. 5 and 6 that show complex constellations 25 obtained by applying that constraint. In those examples, the carrier frequency FC is defined through the $$\text{frequency ratio} = \frac{FC}{F1}.$$

It is observed that the circularity of the constellation 25, and hence the number of usable pulse train segments within the circle 26, varies as a function of ratio R. Namely, the circularity improves when R becomes closer to 1/2.

Figure 7:
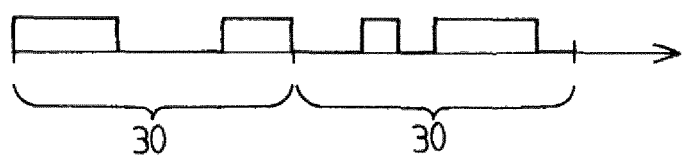
FIG. 7 is a schematic representation of pulse train segments meeting a twin-pulse constraint.
Figure 8:
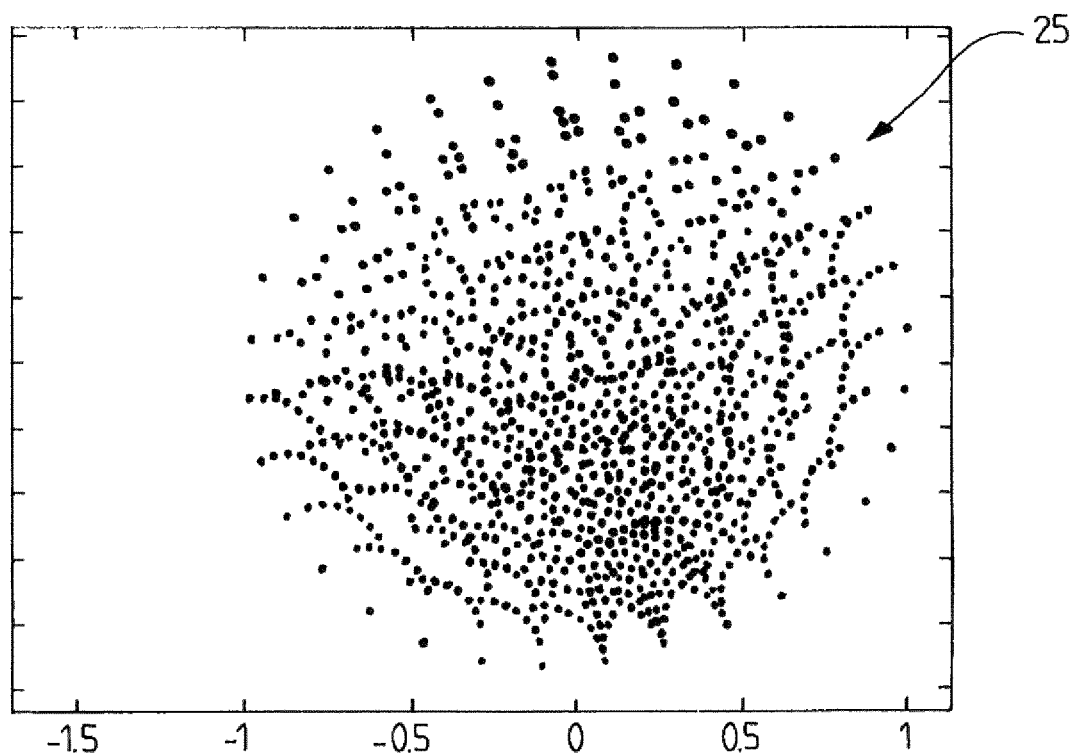
FIG. 8 illustrates a complex energy constellation of a set of dual pulse train segments meeting a twin-pulse constraint at a carrier frequency.

FIG. 7 illustrates a different selection constraint, namely imposing two pulses per pulse train segment with each pulse having a length lower than N/2, a.k.a. twin-pulse constraint. As a consequence, more information is coded at the expense of more pulses per carrier period. For N=16, an initial set of $37^2=1369$ pulse train segments is obtained. FIG. 8 illustrates the corresponding complex constellation 25.

Selection constraints can also be enforced to emphasize the resulting signal in specific parts of the spectrum. In illustrative embodiment of such constraints, a pulse train segment 30 is divided in two half-segments 31 and 32 and a specific rule is applied to define the second half 32.

Figure 9:
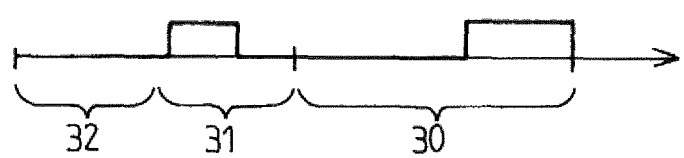
FIG. 9 is a schematic representation of pulse train segments meeting a P-0 constraint.

FIG. 9 illustrates a case in which the second half 32 is uniformly zero, i.e. no pulse is allowed in second half 32. This rule can be used to reduce pulse density at low power, e.g. 6 dB backoff.

Figure 10:
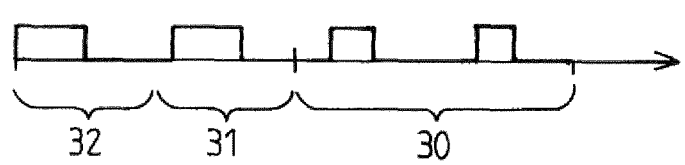
FIG. 10 is a schematic representation of pulse train segments meeting a symmetry constraint.

FIG. 10 illustrates a case in which the second half-segment 32 is a duplicate of the first half-segment 31. This rule can be used to reduce spectrum noise and images above 0.5F1.

In an embodiment, the codebooks resulting from the rules illustrated in FIGS. 9 and 10 can be employed in a same transmitter device enforcing an additional code book selection step as a function of signal power. Namely, the code book of FIG. 9 is used at lower power and the code book of FIG. 10 is used at higher power. This will reduce the number of pulses per carrier period by 2 at low power while keeping good encoder efficiency, similar to Doherty effect.

In a modified embodiment, both constellations resulting from FIGS. 9 and 10 are concatenated at step 40. Therefore, the SDM feedback loop eventually operates to switch from one codebook (FIG. 9) to the other (FIG. 10) depending on average and peak energy of input signal 6.

Figure 11:
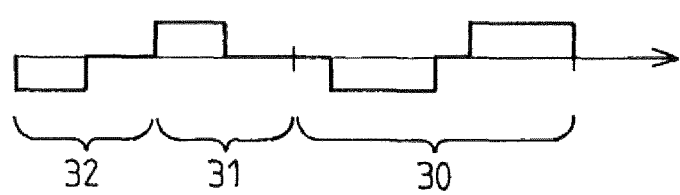
FIG. 11 is a schematic representation of pulse train segments meeting an oppositeness constraint.

FIG. 11 illustrates a case in which the second half-segment 32 is the opposite of the first half-segment 31. This rule can be used to reduce spectrum noise and images around 0 and 2*F1 frequencies, i.e. 0 modulo 2*F1. This is a suitable choice for carrier frequency FC close to F1 and a high pass driver chain in the radio front-end 5. In fact, no energy of noise exists close to DC so that no risk of envelope reconstruction in an AC coupled driver chain ensues, which help keep clean binary pulses along the chain.

Figure 12:
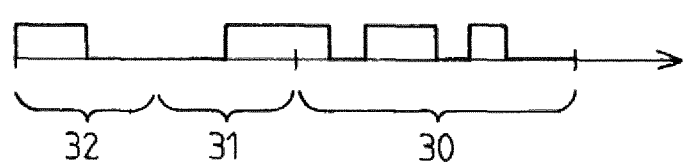
FIG. 12 is a schematic representation of pulse train segments meeting a complementarity constraint.

FIG. 12 illustrates a case in which the second half-segment 32 is the complementary of the first half-segment 31. This rule can be used in similar conditions as FIG. 11 and further provides adequate PWM carrier suppression at frequency F1 to improve the encoder efficiency. Those filtering effects come at the expense of doubling the second over-sampling clock rate F2, and hence doubling ratio N and number of pulses per carried period, a.k.a factor K.

Quantitative Examples

A 4WCDMA radio transmission was simulated by computer.

In a first simulation result, the parameters and results are: FC=1.875 GHz; M=2; F1=2 GHz; N=16; F2=32 GHz; K=3.04; ACLR=73.3 dB; unfiltered 60 dB ACLR bandwidth=88 MHz; max IBW=60 MHz; unfiltered coding efficiency over DC to 2*F1=85.1%; filtered coding efficiency over DC to 2*F1=96.1%; filtered 60 dB ACLR bandwidth=140 MHz. The code book is constrained by the complementary rule (FIG. 12) together with the single-pulse rule in the first half-segment.

In a second simulation result, the modified parameters are only: FC=2.125 GHz; M=0.9412. The results are only modified as: K=2.73; ACLR=74 dB; filtered coding efficiency over DC to 2*F1=96.9%.

It is observed that PPWM constellations enable robust efficiency and ACLR towards input backoff. Efficiency and ACLR degrade slowly over the first 10 dB backoff.

Figure 13:
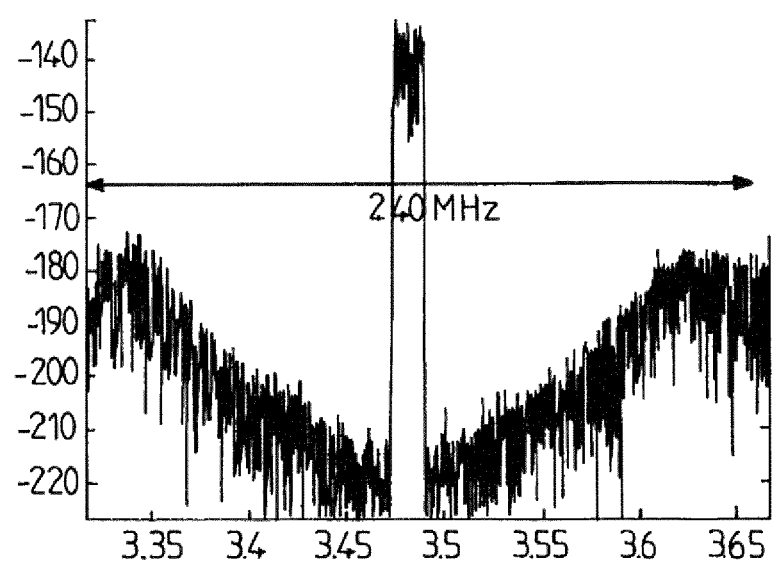
FIG. 13 is a graph showing the spectrum of PPWM signal that can be generated with the modulation device of FIG. 2.

FIG. 13 illustrates the spectrum of the pulsed time-domain signal 7 obtained in a similar simulation case in which: FC=2.125 GHz; F1=2 GHz; N=32; F2=64 GHz. The code book is constrained by the complementary rule (FIG. 12) together with the single-pulse rule in the first half-segment.

In the foregoing, reference has been made to single-level pulse trains. However, similar mapping and coding methods are applicable to richer constellations in which a quantized pulse-level dimension is added, i.e. pulse train segments including multi-level pulses. It will be appreciated that doubling the number of amplitude states of the pulses will cause a quadratic expansion of the constellations. Such multi-level pulse trains are especially suited to drive multi-branch power amplifiers in which the multi-level pulse train is eventually converted to plural parallel single-level pulse trains, so that each parallelized single-level pulse train drives a respective amplifier branch to switch only part of the total power.

Embodiments of the above multi-level principle will be described in reference to FIGS. 14 and 15.

Figure 14:
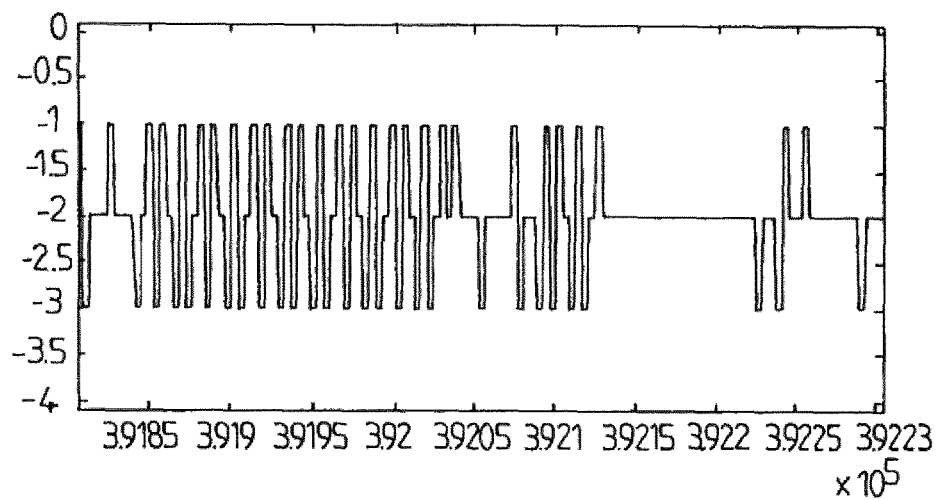
FIG. 14 is a time-domain graph showing a three-level pulse train that can be generated by the modulation device of FIG. 2 in an embodiment.

In FIG. 14, a simulation result in shown of a 3-level pulse train suitable to drive a 2-way symmetric pulse feed type amplifier. The simulation parameters are: N=8; FC=2.125 MHz; F1=2 GHz; F2=16 GHz. Two independent parallel single-level pulse sequences are generated with a code book constrained by the complementary rule (FIG. 12) together with the single-pulse rule in the first half-segment. These parameters imply that a code book of 11 pulse trains is generated with 2 pulses per train. The summed result is a pulse train taking 3 relative values −1; 0; +1, i.e. with a total of 51 multi-level pulse trains in the resulting codebook. The 2-way symmetric pulse feed type amplifier can be realized with a tristate class S scheme.

By employing two branches in amplitude, some properties of the legacy multi-branch Doherty amplifiers can be retrieved. The following examples mimic a 2-way asymmetric 1:2 pulse feed Doherty and a 3 way symmetric pulse feed Doherty In the 2-way asymmetric 1:2 pulse feed Doherty case, two independent parallel single-level pulse sequences are generated with a code book constrained by the complementary rule (FIG. 12) together with the single-pulse rule in the first half-segment. These parameters imply that a code book of 11 pulse trains is generated with 2 pulses per train. The second sequence has double amplitude compared to the first sequence. Hence, two same but de-correlated pulse train segment codebooks are generated, each taking two levels, respectively 0-1 and 0-2. The summed result is a pulse train taking 4 relative values −1.5; −0.5; +0.5; +1.5, i.e. with a total of 121 multi-level pulse trains in the resulting codebook. An optimal average K=1.45 pulses per carrier period is observed. By feeding each train to a power amplifier branch, an asymmetric Doherty is emulated.

Figure 15:
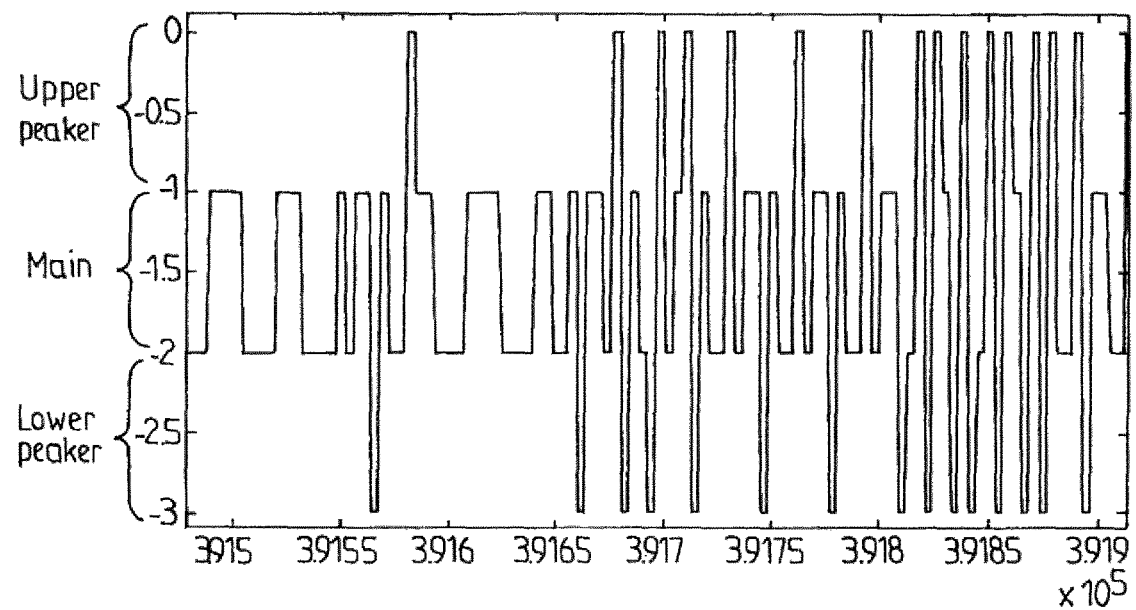
FIG. 15 is a time-domain graph showing a four-level pulse train that can be generated by the modulation device of FIG. 2 in an embodiment.

The case of a 3-way symmetric pulse feed Doherty amplifier is illustrated in FIG. 15. The same codebook and constellations are employed as in the previous 2-way asymmetric case, with only differences in the power amplifier feed. Namely, the scheme uses three even branches in a Doherty way. The initial 3-level pulse train is converted into 3 binary pulse trains at the same clock speed F2=16 GHz. There results one main pulsed signal and two even peakers acting respectively for upper and lower envelope peaks. The other parameters of the simulation are N=8; FC=2.125 MHz and F1=2 GHz.

Figure 16:
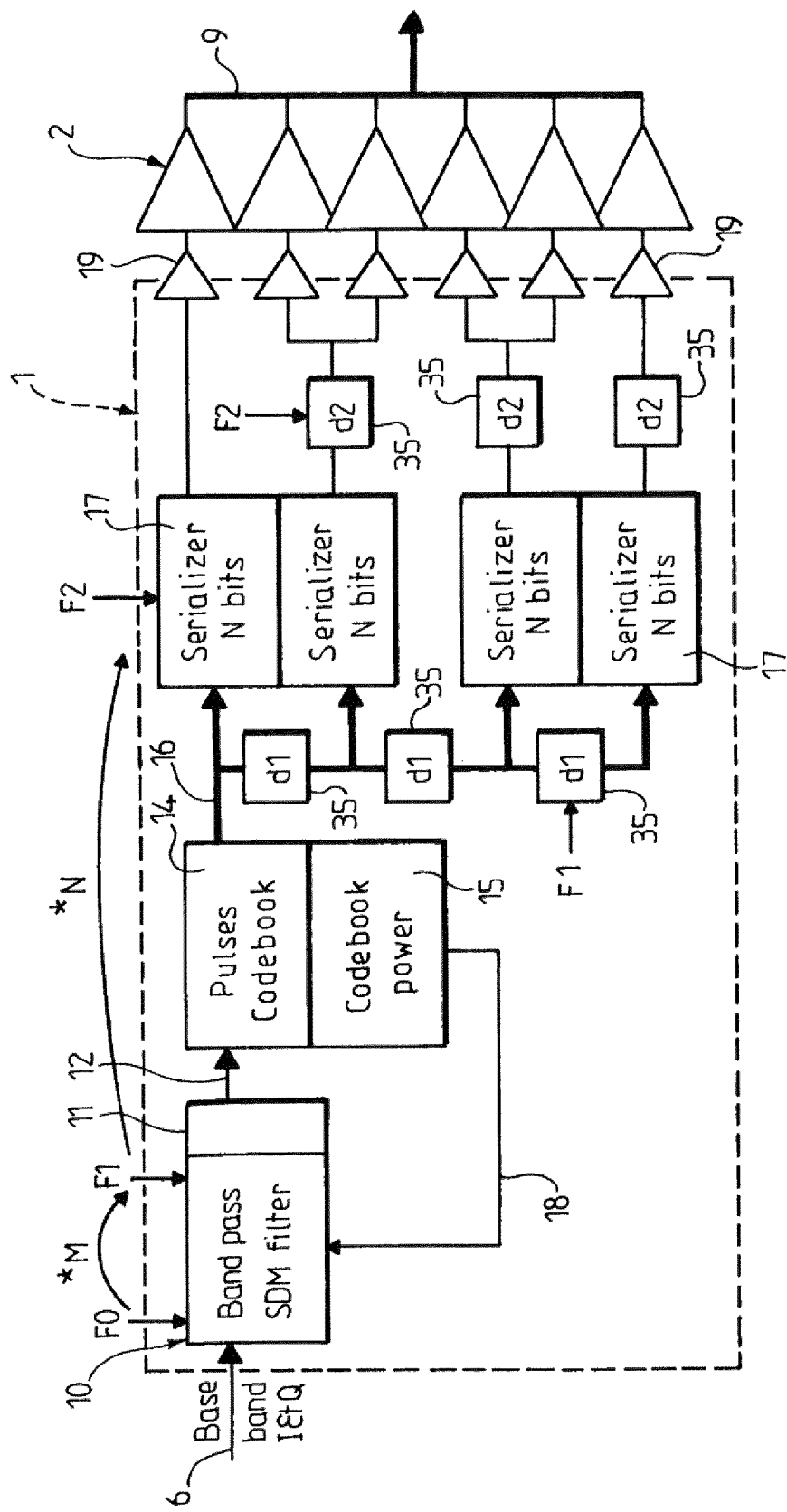
FIG. 16 is a functional representation of a signal modulation device that can be used in the transmitter of FIG. 1 in accordance with another embodiment.

FIG. 16 shows another embodiment of the modulation device 1 comprising additional FIR filters for digital filtering. Elements identical or similar to those of FIGS. 1 and 2 are designated by the same numeral.

The power amplifier 2 is made of 6 small drivers and power transistors with 6 even groups of fingers. A spatial FIR filtering is added in the modulation device 1 with low quantization and limited number of taps to map onto the 6 distributed drivers 19 of the last stage transistors fingers. The summing point of the fingers, i.e. amplifier drain 9 is the filter output.

The figure shows an example with 4 taps and 6 identical fingers: the 4 taps [½ 1 1 ½] are iso-spaced to create a periodic frequency response: one harmonic falls onto FC with some stop bands close to the PPWM carriers and the SDM images modulo F1.

Taps delays 35 can be programmable by digital delay trees and one serializer per tap. The arrangement provides programmability to adapt to both FC and IBW targets as well as compensate for amplifier geometry delays and phase imbalance between fingers, especially larger dies and power.

The FIR performances are very robust to tap finger gain mismatch, e.g. as high as 20% mismatch, which is usually slightly more than fingers mismatch on a same power transistor die. The filter taps 35 clean up the SDM PPWM noise for example in RX band or adjacent TX band. However, it does not increase the encoder efficiency, as cancelled TX noise is simply dissipated in the PA last stage die.

In the foregoing, a method for computing the complex energy to store in the predistorsion table 15 was described. In an embodiment, the predistorsion table 15 is populated through experimental measurements of the complex energy of the selected pulse train segments at the carrier frequency FC. Such measurements bring about the benefits of taking into account the analogical properties of the radio-front end 5, such as finite transition slopes, memory effect of drivers and the like.

In fact, the analogical properties of the radio-front end 5 cause the spectrum of the radiated electromagnetic field to be slightly different from the spectrum of the output signal 7 of the pulse generator 17. However, a better efficiency of the predistortion feedback loop can be obtained by taking into account the pulsed signal that was actually radiated by the antenna 4 rather than its ideal digital representation. For that purpose, the complex energy coefficients 18 can be determined or refined through experimental measurements, which can be conducted as follows: the sigma delta modulator 10 is controlled to repeat a given pulse train segment over an adequate measurement period, during which a detector is employed to measure the amplitude and phase of the radiated field about the carrier frequency FC. The measured phase is a relative phase with respect to a given reference, e.g. any pulse train of the codebook having non zero energy and a measurable phase at the carrier frequency FC. For error minimization the reference pulse should preferably be one with high energy at the carrier frequency FC a.k.a preferably on the periphery of the constellation. The process is repeated for all pulse train segments of the codebook and the predistorsion table 15 is populated accordingly.

While the foregoing describes methods for selecting specific codebooks optimized for specific applications, it should be noted that the tables 14 and 15 may also be populated to generate well-known coding schemes, e.g. a conventional PWM coding scheme. As PWM generation is well known in the art, this alternative need not be further detailed.

Figure 17:
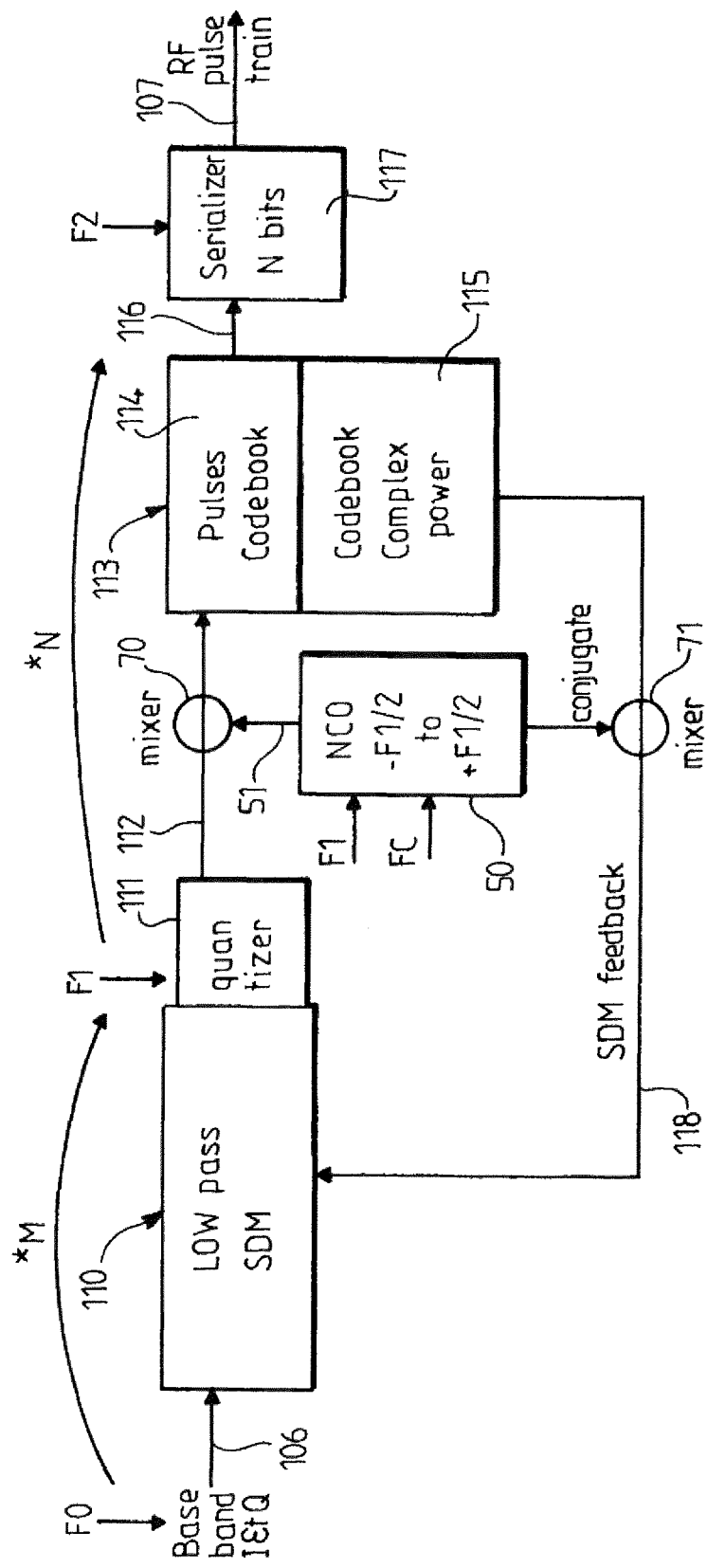
FIG. 17 is a conceptual representation of a signal modulation device that can be used in the transmitter of FIG. 1 in accordance with another embodiment.
Figure 18:
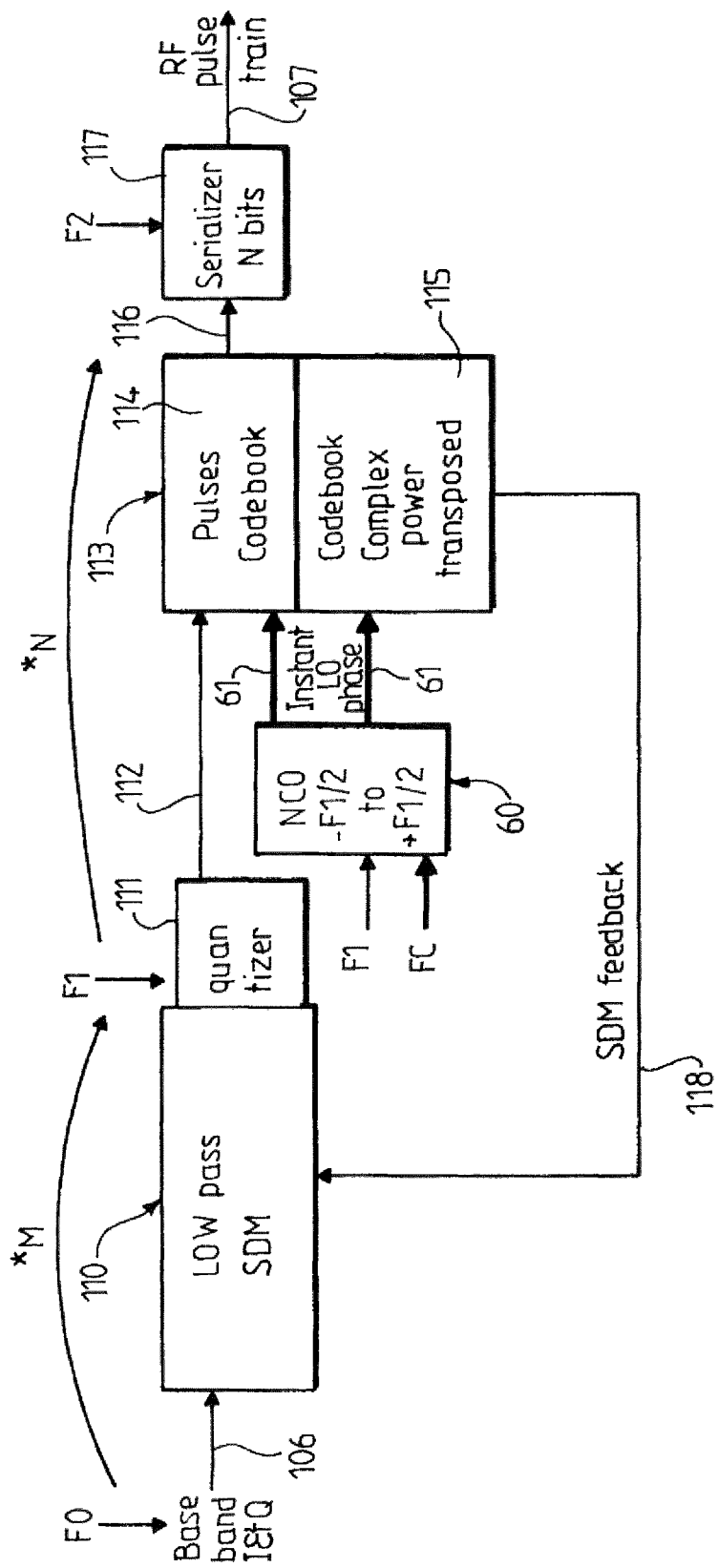
FIG. 18 is a functional representation of a signal modulation device that emulates the signal modulation device of FIG. 17.

Turning now to FIGS. 17 and 18, an embodiment of an emulated band pass sigma delta modulator will be described. Elements which have a similar function to those previously described in FIGS. 2 and 3 are designated by the same reference numeral increased by 100.

A basic idea in FIGS. 17 and 18 is to emulate a band pass sigma delta modulator by using a low pass sigma delta modulator 110 together with a numerically controlled oscillator (NCO) 50 for effecting two digital frequency transpositions at the carrier frequency of interest FC, i.e. a first digital transposition by a first mixer 70 located between the first quantizer 111 and the mapping table 114 and a second digital transposition by a second mixer 71 located in the feedback loop of the sigma delta modulator 110.

The low pass sigma delta modulator 110 has a clean bandwidth centered on DC (0 Hz) of which the width may be about 5% of the oversampling frequency F1, and operates to reject quantization noise outside that low frequency band.

The numerically controlled oscillator 50 is a digital generator which creates a clocked discrete-time, discrete-valued representation of a sinusoidal waveform which oscillates at a controlled frequency. In FIG. 17, the NCO 50 receives the clock signal at the oversampling frequency F1 and a control signal set to impose the carrier frequency of interest FC. Namely, the NCO 50 delivers at each F1 clock period a complex digital number 51 which approximates the instantaneous value of a complex sinusoidal carrier wave oscillating at carrier frequency FC.

The mixer 70 is a complex multiplier that multiplies the quantized complex intermediary signal 112 delivered by quantifier 111 by the complex digital number 51, to produce the up-converted intermediary signal 52. Since the output signal 51 is coded over a finite number of bits, the up-converted intermediary signal 52 is also coded over a finite number of bits and can be used, as in the foregoing, to access a symbol mapping table 114 and a digital predistorsion table 115. However, a difference with the foregoing embodiments lies in the fact that the number of complex quantized states of the up-converted intermediary signal 52 will generally be much higher than the number of states of intermediary signal 112. This point will be illustrated in reference to FIG. 20.

Figure 20:
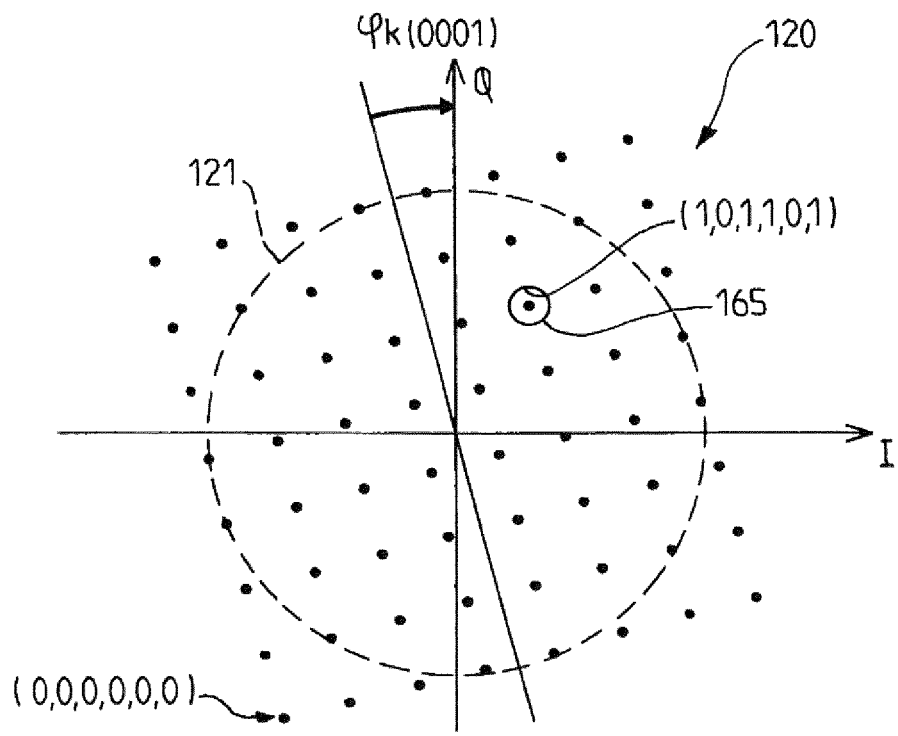
FIG. 20 is a graph showing a complex energy constellation that can be obtained with a sigma delta modulator of the modulation devices of FIGS. 17 to 19.

In FIG. 20, the complex constellation of intermediary signal 112 is assumed to be identical to that of intermediary signal 12. FIG. 20 actually shows a constellation 120 obtained by rotating the complex constellation 20 of FIG. 3 by a certain instantaneous phase angle $-\varphi_k$, so as to represent the multiplication of intermediary signal 112 by a complex number $e^{-\varphi_k}$ at mixer 70. It should be noted that a respective rotated constellation 120 will be obtained for each different phase the NCO output signal 51.

Therefore, in order to exploit a symbol mapping table 114 and a digital predistorsion table 115 in the same manner as in the foregoing, the tables have to be populated for each quantized state of quantifier 111 in each and every possible rotated constellation 120, which causes the table size to be expanded by a factor equal to the number of discrete values of the phase angle $\varphi_k$. This observation implies to code the instantaneous phase over a rather limited number of bits, e.g. 4 bits or 16 discrete values, otherwise the memory access time may become too long and disturb SDM stability.

Since the digital predistorsion table 115 is populated with complex energy coefficients derived from a rotated constellation 120, the mixer 71 must operates to multiply the retrieved coefficient by the conjugate value of output signal 51 prior to feeding it back to SDM modulator 110.

The above operations is a rather conceptual view because complex mixers 70 and 71 are complex digital multipliers which cannot be realized at the carrier frequency of interest, e.g. a few GHz, without a huge delay that would jeopardize the bandwidth of SDM modulator 110 and the stability of the feedback loop. In reference to FIG. 18, a preferred embodiment based on the same concept will now be described, in which the operations of multipliers 70 and 71 are substituted with pre-computations that are swallowed up in the symbol mapping table 114 and a digital predistorsion table 115.

In FIG. 18, the NCO 60 delivers a time-domain quantized signal 61 that represents the instantaneous phase $\varphi_k$ of the carrier wave oscillating at the selected carrier frequency FC. In an embodiment, the quantized phase signal 61 is coded over 4 bits. The post quantizer mixer 70 is now made implicit by increasing address field that serves for pulse code selection by NCO bits, e.g. 4 bits, which represent the quantized instant phase of a digital local oscillator. This point will be better understood by comparing again FIGS. 3 and 20.

In FIG. 3, a quantized state of the constellation 20 can be uniquely represented by a 6-bit address, e.g. address 101101 for the circled state 65. By contrast, in FIG. 20, keeping in mind that there exists a rotated constellation 120 for each discrete value of the phase angle $\varphi_k$, a quantized state of the constellation 120 can be uniquely represented by a 10-bit address e.g. address 101101/0001 for the circled state 165. This is because both the amplitude of components I and Q and the instantaneous phase angle have to be combined to define an individual state.

Figure 21:
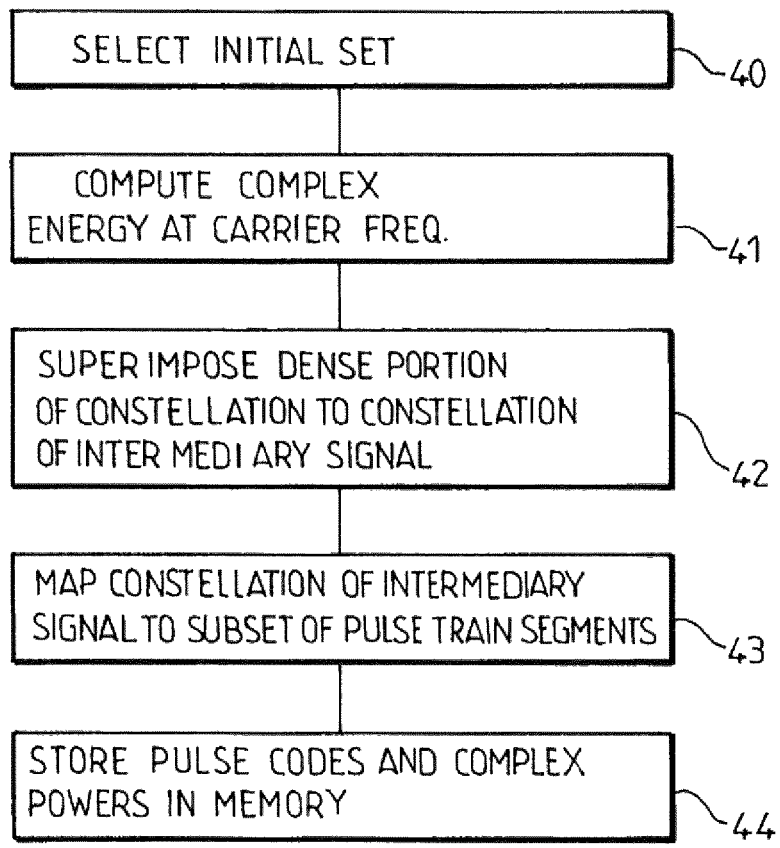
FIG. 21 is a flow diagram of a codebook selection method.

In view of the above, the codebook selection methods described in reference to FIG. 21 can be employed to populate the table 114, yet with each and every rotated constellation 120. As a consequence, the codebook size will be expanded by a factor 16 for a phase signal 61 coded over 4-bits.

As for the resulting complex energy coefficients 118, multiplication by the conjugate factor number $e^{i\varphi_k}$ must be made prior to storing in the digital predistorsion table 115, as a substitute to employing mixer 71.

For the rest, the operation of memory 113 and pulse generator 117 is similar to that of memory 13 and pulse generator 17 and need not be described further.

The above described method for emulating a local oscillator enables to shift the clean bandwidth of the low pass SDM modulator 110 to a desired RF carrier frequency band that is only constrained by the oversampling clock rate F1. The NCO 50 or 60 controls the spectrum translation, so that the carrier frequency is selected by the NCO 50 or 60 anywhere between 0 and F1. With special band pass pulse trains (see FIG. 12), even the second Nyquist zone can be selected.

As a consequence, sub GHz cellular bands can be synthesized with the same instant clean bandwidth as upper bands, e.g. 2 GHZ and with same the SDM clock rate F1. In an embodiment, a digital radio transmitter is obtained which is adapted to cover 700 to 2200 MHz while using fixed clocks at rates F1 and F2.

For a better frequency resolution, the number of bit of NCO output signal 61 must be larger. As an example, a 10 MHz step for F1=2 GHz clock implies to code the phase over 8 bits. An expansion factor of 256 ensues for the mapping tables that may cause access time issues at such a high speed. Therefore the instant phase signal is preferably limited to 3 or 4 bits.

Figure 19:
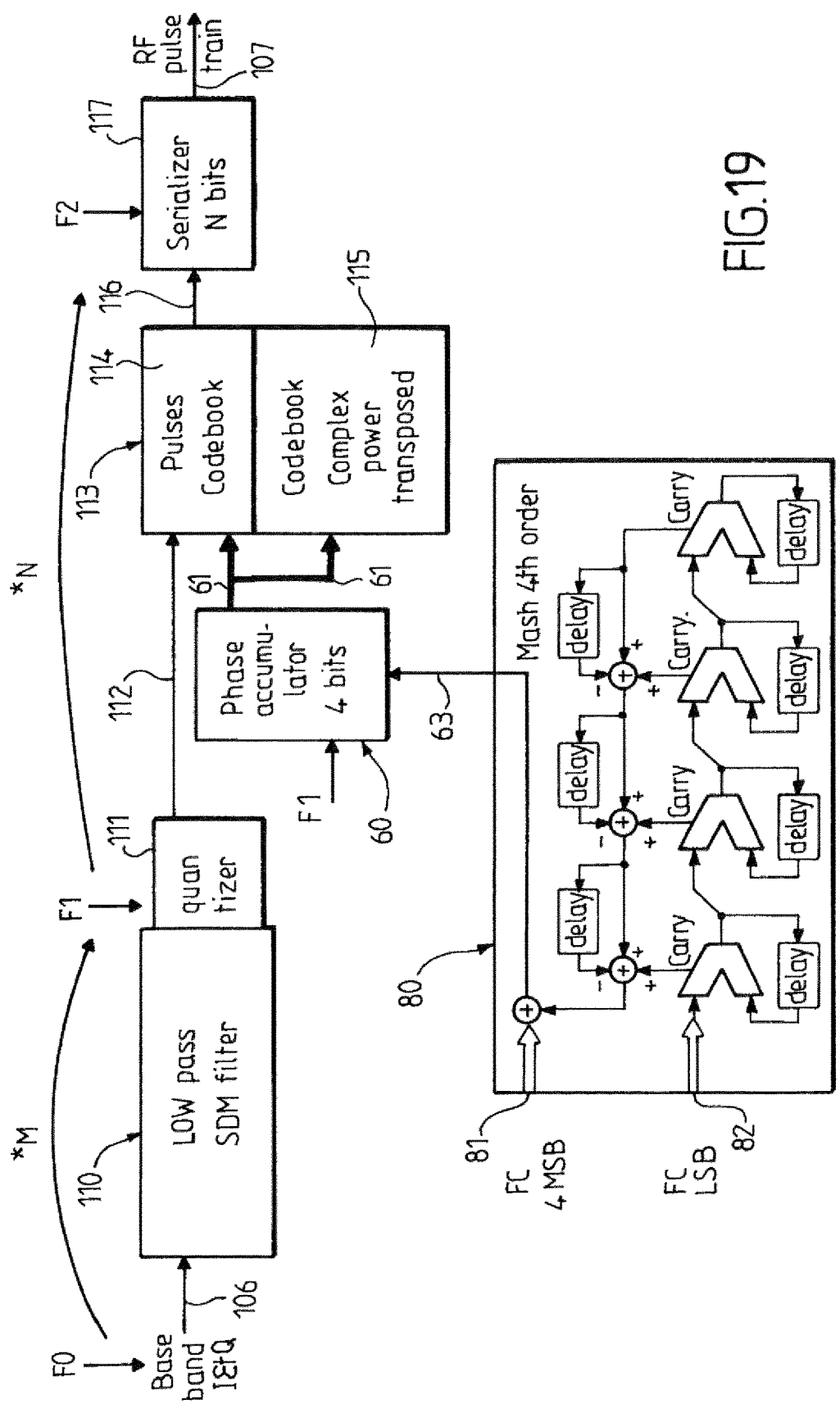
FIG. 19 is a functional representation of a modified embodiment of the signal modulation device of FIG. 18.

With reference to FIG. 19, another embodiment based on the same principle employs a MASH noise shaping filter 80 to generate the NCO phase signal 61. Namely the control signal 63 of the NCO 60 is delivered through a dithering engine made of a Mash delta sigma filter 80, which is easy to pipeline at high speed with no stability issue. The MASH filter 80 receives a refined carrier frequency value FC, e.g. coded over 7 bits, and receives the most significant bits at a first input 81 and the least significant bits at a second input 82. Although a $4^{th}$ order filter is shown, $2^{nd}$ or $3^{rd}$ order may be enough for good dithering of phase and frequency spurs.

An advantage of the emulated bandpass sigma delta modulator of FIGS. 17 to 19 is that the complete SDM structure includes the function of transposing the baseband input signal 6 or 106 at the RF carrier frequency of interest. It should be noted that the bandpass sigma delta modulator 10 of FIG. 2 can be made differently. However, some bandpass sigma delta modulation schemes require the frequency transposition to be done prior to entering the SDM modulator. In other words, some native bandpass SDM structures need an input signal 6 that is not the baseband signal 6, but as an already transposed version of it at carrier frequency FC, thus requiring a much higher oversampling rate F1.

The foregoing modulation devices could be e.g. hardware means like e.g. an ASIC, or a combination of hardware and software means, e.g. an ASIC and an FPGA, or at least one microprocessor and at least one memory with software modules located therein.

The invention is not limited to the described embodiments. The appended claims are to be construed as embodying all modification and alternative constructions that may be occurred to one skilled in the art, which fairly fall within the basic teaching here, set forth.

The use of the verb "to comprise" or "to include" and its conjugations does not exclude the presence of elements or steps other than those stated in a claim. Furthermore, the use of the article "a" or "an" preceding an element or step does not exclude the presence of a plurality of such elements or steps.

In the claims, any reference signs placed between parentheses shall not be construed as limiting the scope of the claims.

The invention claimed is:

1. A signal modulation device for providing an output signal to a radio frequency front-end, the device comprising:
   an input for receiving a complex input signal comprising an in-phase component signal and a quadrature-phase component signal,
   a sigma-delta modulator for modulating the complex input signal at an oversampling clock rate into an intermediary signal, wherein the intermediary signal includes a first finite number of quantized complex states,
   a symbol mapping table for mapping the quantized complex states of the intermediary signal to predefined quantized symbols each encoding a pulse train segment of the output signal,
   a numerical oscillator for generating a phase signal oscillating at a selected carrier frequency, wherein the phase signal includes a second finite number of quantized states,
   wherein the symbol mapping table comprises said predefined quantized symbols, at least one predefined quantized symbol for each quantized complex state of the intermediary signal and each quantized state of the phase signal, and operates at each of a plurality of oversampling clock periods to select a predefined quantized symbol as a function of a current quantized complex state of the intermediary signal and a current quantized state of the phase signal, and
   a pulse generator arranged to receive the predefined quantized symbol selected at each of the plurality of oversampling clock periods, wherein the pulse generator is adapted to generate the pulse train segment encoded by the received predefined quantized symbol, wherein the generated pulse train segment encodes an information content of the complex input signal in the positions and/or widths and amplitudes of the pulses of the pulse train segment, wherein the pulse generator operates at a second oversampling clock rate.

2. The device in accordance with claim 1, further comprising:
   a digital predistortion table for mapping the quantized complex states of the intermediary signal to predefined predistorsion symbols, and
   a feedback loop for providing the predefined predistorsion symbols to the sigma-delta modulator.

3. The device in accordance with claim 2, wherein the digital predistortion table comprises a predefined predistortion symbol for each quantized complex state of the intermediary signal and each quantized state of the phase signal, and operates at each of the plurality of oversampling clock periods to select a predistortion symbol as a function of the current quantized complex state of the intermediary signal and the current quantized state of the phase signal.

4. The device in accordance with claim 2, wherein the digital predistortion table comprises a predefined predistortion symbol for each quantized complex state of the intermediary signal and each quantized state of the phase signal and wherein the each predefined predistortion symbol associated to a corresponding complex quantized state of the intermediary signal and a corresponding quantized state of the phase signal is a function of a frequency-domain complex energy coefficient of the pulse train segment encoded by the corresponding predefined quantized symbol at the selected carrier frequency and a complex phase coefficient corresponding to the quantized state of the complex phase signal.

5. The device in accordance with claim 1, wherein the quantized symbol comprises a parallel binary sequence and wherein the pulse generator comprises a serializer adapted to serialize the parallel binary sequence at the second oversampling clock rate.

6. The device in accordance with claim 1, wherein the phase signal is coded over a predefined number of bits.

7. The device in accordance with claim 6, wherein the numerical oscillator comprises a phase accumulator operating as a function of a control signal defining the selected carrier frequency coded over the predefined number of bits and a clock signal at the first oversampling clock rate, the device further comprising a multi-stage low pass noise shaping sigma delta filter arranged to provide the control signal coded over the predefined number of bits by filtering a refined control signal coded over a higher number of bits.

8. The device in accordance with claim 1, further comprising a rate-adjustable clock arranged to provide a clock signal at the first oversampling clock rate, wherein the first oversampling clock rate is adjustable over a small adjustment range.

9. The device in accordance with claim 1, wherein the symbol mapping table is obtained as follows:
    selecting an initial set of pulse train segments having a time-granularity corresponding to the second oversampling clock rate,
    determining a frequency-domain complex energy coefficient of the pulse train segments of the initial set at the carrier frequency, and
    for each quantized state of the phase signal,
    computing a complex phase coefficient corresponding to the quantized state of the complex phase signal, and
    selecting a subset of the pulse train segments of which the frequency-domain complex energy coefficients at the carrier frequency closely approximate the quantized complex states of the intermediary signal multiplied by the complex phase coefficient, so that each quantized complex state of the intermediary signal is uniquely mapped to a pulse train segment of the subset,
    for each pulse train segment to which a quantized complex state is mapped, recording a quantized symbol encoding the pulse train segment at a memory address associated to a combination of the quantized complex state of the intermediary signal combined with the quantized state of the phase signal.

10. A signal modulation method for providing an output signal to a radio frequency front-end, the method comprising:
    receiving a complex input signal comprising an in-phase component signal and a quadrature-phase component signal,
    sigma-delta modulating the complex input signal at an oversampling clock rate into an intermediary signal, wherein the intermediary signal includes a first finite number of quantized complex states,
    generating a phase signal oscillating at a selected carrier frequency, wherein the phase signal includes a second finite number of quantized states,
    accessing a symbol mapping table at each oversampling clock period to select a quantized symbol encoding a pulse train segment of the output signal as a function of a current quantized complex state of the intermediary signal and a current quantized state of the phase signal,
    wherein the symbol mapping table comprises a predefined quantized symbol for each quantized complex state of the intermediary signal and each quantized state of the phase signal,
    generating the pulse train segment encoded by the selected quantized symbol with a pulse generator operating at a second oversampling clock rate, wherein the generated pulse train segment encodes an information content of the complex input signal in the positions and/or widths and amplitudes of the pulses of the pulse train segment.

* * * * *